United States Patent
Gen-ei et al.

(10) Patent No.: US 6,804,276 B2
(45) Date of Patent: Oct. 12, 2004

(54) SEMICONDUCTOR LASER DEVICE WHICH REMOVES INFLUENCES FROM RETURNING LIGHT OF THREE BEAMS AND A METHOD OF MANUFACTURING THE SAME

(75) Inventors: Koichi Gen-ei, Ichikawa (JP); Kazuo Fukuoka, Yokohama (JP); Seiji Iida, Yokohama (JP); Makoto Okada, Ichikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/954,475

(22) Filed: Sep. 14, 2001

(65) Prior Publication Data

US 2002/0105981 A1 Aug. 8, 2002

(30) Foreign Application Priority Data

Sep. 19, 2000 (JP) .................................... 2000-282852

(51) Int. Cl.[7] .............................................. H01S 5/00
(52) U.S. Cl. ............................ 372/36; 372/49; 372/45; 372/43; 372/46
(58) Field of Search ............................ 372/36, 49, 45, 372/46, 75

(56) References Cited

U.S. PATENT DOCUMENTS

| 4,844,581 A | * | 7/1989 | Turner | 385/91 |
|---|---|---|---|---|
| 5,517,479 A | * | 5/1996 | Nakanishi et al. | 369/44.23 |
| 5,923,692 A | * | 7/1999 | Staskus et al. | 372/50 |
| 6,278,681 B1 | * | 8/2001 | Nagano | 369/112.16 |
| 6,364,541 B1 | * | 4/2002 | Nesnidal et al. | 385/92 |
| 6,448,552 B1 | * | 9/2002 | Mizutani et al. | 250/231.12 |
| 6,452,880 B1 | * | 9/2002 | Kawamura et al. | 369/44.37 |
| 2003/0031217 A1 | * | 2/2003 | Ariyoshi | 372/36 |

FOREIGN PATENT DOCUMENTS

| JP | 62026653 A | * | 2/1987 | ............ G11B/7/13 |
|---|---|---|---|---|
| JP | 63175490 A | * | 7/1988 | ............ H01S/3/18 |
| JP | 09-214037 | | 8/1997 | |
| JP | 2001-036178 | | 2/2001 | |

* cited by examiner

Primary Examiner—David Vu
Assistant Examiner—Dung T Nguyen
(74) Attorney, Agent, or Firm—Hogan & Hartson, LLP

(57) ABSTRACT

A semiconductor laser chip has an emission facet for emitting a laser beam. A sub-mount has a first surface and at least one second surface vertical to the first surface. The semiconductor laser chip is provided on the first surface of the sub-mount. The second surface arranged in line with the emission facet of the semiconductor laser chip is inclined at an angle of 3 to 30 degrees. The inclined second surface reflects reflection light of a sub-beam diffracted from a main beam emitted by the semiconductor laser chip.

25 Claims, 5 Drawing Sheets

SEMICONDUCTOR LASER DEVICE WHICH REMOVES INFLUENCES FROM RETURNING LIGHT OF THREE BEAMS AND A METHOD OF MANUFACTURING THE SAME

CROSS-REFERENCE TO RELATED APPLICATIONS

This application is based upon and claims the benefit of priority from the prior Japanese Patent Application No. 2000-282852, filed Sep. 19, 2000, the entire contents of which are incorporated herein by reference.

BACKGROUND OF THE INVENTION

1. Field of the Invention

The present invention relates to a semiconductor laser device and particularly to a semiconductor laser device including a semiconductor laser element adapted for an optical pickup based on a tracking servo system using a three-beam method.

2. Description of Related Art

A CD-ROM (Compact Disk-Read Only Memory) has come to be indispensable as a recording medium for a personal computer (PC). In an optical pickup used for an optical disk, tracking control generally adopts a system called a 3-beam method.

FIG. 9 shows a schematic view of an optical system adopted to the 3-beam system. A laser beam 601 emitted from a semiconductor laser element such as a laser diode (not shown) is guided to a diffraction grating 602. The diffraction grating 602 generates diffraction lights of 0-order, 1-order, and −1-order. The diffraction lights pass through a collimator lens 603, a half-mirror 604, and an objective lens 605 and have a focus point on an optical disk 610. That is, three beams of a main beam 606 and sub-beams 607 and 608 are focused on the optical disk 610. Reflection lights from the optical disk 610 are guided to the half-mirror 604 passing again through the objective lens 605 and are reflected on the half-mirror 604, to enter into patterned PDS (photo diodes) 611. Incident light is photoelectrically converted at each PD 611. The signal outputted from each PD 611 is calculated to obtain a position shift of the beam. The calculation result is fed back to a drive part of the optical pickup and is controlled so as to let the main beam 606 follow the track 609.

The tracking control based on the 3-beam method covers a wide following range, and no limitation is put on the density and phase of the disk. Therefore, the tracking control is less influenced by variations in the disk quality. Accordingly, this is suitable for an optical pickup for reading. This method, however, has a problem of returning light from sub-beams.

That is, as shown in FIG. 10, two sub-beams 705 reflected from the disk partially return to the upper and lower sides of the laser diode chip (hereinafter called a LD chip) 701 (this is hereinafter called 3-beam returning light). The two sub-beams 705 are distant from the laser beam 703 by a distance d. For example, when the 3-beam returning light 705 is guided to the side of the sub-mount, the beams are reflected again on the side surface of the sub mount 704. Therefore, reflection light 707 is generated from the 3-beam returning light and is mixed into the optical system. Consequently, a tracking error is caused in some cases.

To avoid this problem, a sub-mount 801 as shown in FIG. 11 is used. A side surface of this sub-mount 801 that is positioned just below the laser beam emission facet of the LD chip 701 has three parts. That is, an upper part of the side surface of the sub-mount is formed to be vertical to the upper surface 802 of the sub-mount. A part of the side surface near a position at a distance d (see FIG. 10) from the emission point is inclined at an angle θ. A lower part of the side surface of the sub-mount is also formed to be vertical to the upper surface 802 of the sub-mount. The beam direction of the 3-beam returning light 705 is refracted in correspondence with the inclination angle θ of the inclined part. For example, the beam direction of the returning light 705 which returns in a direction vertical to the laser beam emission side surface 808 is refracted by 2θ, according to Snell's law. NA (Numerical Aperture) of a collimator lens for a CD is about 0.1. An estimated half angle is about 5.7 degrees where the relationship of NA=n×sin θ. At this time, if the inclination angle is 3 degrees or more, the returning light reflected on the side surface of the sub-mount is incident again to the collimator lens 603 (see FIG. 9), and is thus prevented from mixing into the optical system. Thus, influences from the 3-beam returning light can be eliminated by inclining the side surface of the sub mount 801 at an angle corresponding to the NA of the collimator lens.

If a countermeasure is taken only against the returning light of the 3 beam optical system, the entire side surface of the sub-mount may be inclined. However, in case of die-bonding the sub-mount to a metal heatsink or die-bonding the LD chip to the sub-mount, the optimal axis direction must be set precisely. Therefore, operation for letting the laser beam emission facet of the LD chip collide with a positioning pin is required. Hence, constant areas on the upper and lower parts of the side surface of the sub-mount are formed to be vertical to the upper surface of the sub-mount. That is, an inclined part is formed only on a part of the side surface of the sub-mount upon requirements, as shown in FIG. 11.

The sub-mount 801 is formed by a dicing process as shown in FIGS. 12A and 12B. At first, as shown in FIG. 12A, a sub-mount substrate 902 is partially cut by a blade 901 having a substantial V-shape. In this manner, a vertical part and an inclined part at an upper part of a side surface of the sub-mount are formed. Next, as shown in FIG. 12B, the sub-mount substrate 902 is cut and divided by a blade 903 having a normal shape. At this time, another vertical part at a lower part of the side surface of the sub-mount in the laser-beam emission side is formed. Thus, a sub-mount 904 having three side surfaces corresponding to the laser-beam emission facet is formed. That is, this sub-mount 904 has two flat parts respectively having heights a and e for abutting with a pin, and an inclined part as a countermeasure against 3-beam returning light, which has a height b and a depth c. The heights a and b and the depth c need to be highly precise, within a margin of error of about 10 μm. Therefore, when cutting is carried out by the V-shape blade 901, the position of the blade must be controlled precisely in the plane direction and in the depth direction. In addition, when cutting is carried out by the blade 903 having a normal shape, the blade must be positioned precisely. Further, the shape of the V-shape blade changes due to friction as cutting continues. To cope with the effect of friction, the cutting depth must be changed, and the inclined part must be matched with the required dimensions. Therefore, a complicated adjustment operation is required.

As described above, the sub-mount having the structure shown in FIG. 11 has a very complicated structure and is difficult to manufacture. The cost for the sub-mount is too high to enable an effective entire cost reduction for the semiconductor laser device.

Hence, there has been a demand for a semiconductor laser device and a method for manufacturing the same, which are capable of consistently removing the influences of the returning light of three beams, and enable excellent mass-productivity.

BRIEF SUMMARY OF THE INVENTION

According to an aspect of the invention, there is provided a semiconductor laser device comprising: a semiconductor laser chip having an emission facet for emitting a laser beam; and a sub-mount having a first surface on which the semiconductor laser chip is provides, and at least one second surface vertical to the first surface, wherein one of the second surface, which is arranged in line with the emission facet of the semiconductor chip, is inclined at an angle of 3 to 30 degrees to the emission facet, and the second surface which is inclined reflects reflection light of a sub-beam diffracted from the laser beam emitted from the semiconductor laser chip.

DETAILED DESCRIPTION OF THE INVENTION

In the following, embodiments of the present invention will be explained with reference to the drawings.

At first, the first embodiment will be explained with reference to FIGS. 1, 2, and 6.

Figure 1:
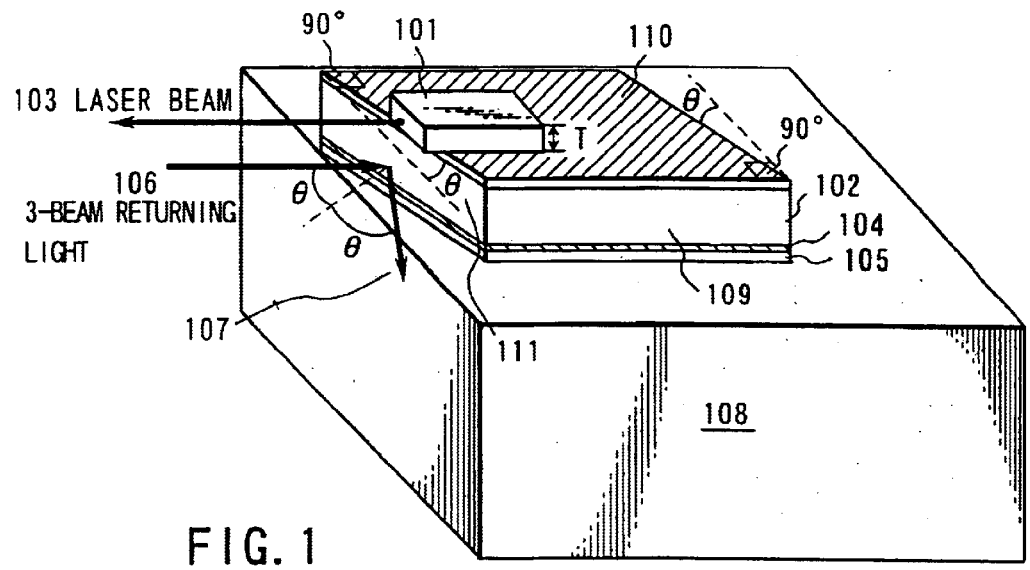
FIG. 1 is a schematic perspective view showing a semiconductor laser device according to the first embodiment of the present invention.

In FIG. 1, an LD chip 101 is mounted on a sub-mount by a junction-down such that a junction area oriented downward. The junction area generates a large amount of heat. By providing the junction area close to the sub-mount 102, the heat radiation efficiency of the LD chip 101 can be improved. Therefore, the increase of the temperature at the light emission part of the LD chip 101 can be reduced. It is estimated that the case temperature Tc is about 70 to 75° C. when using a CD-ROM. However, in this case, the LD chip 101 can be operated steadily.

Figure 9:
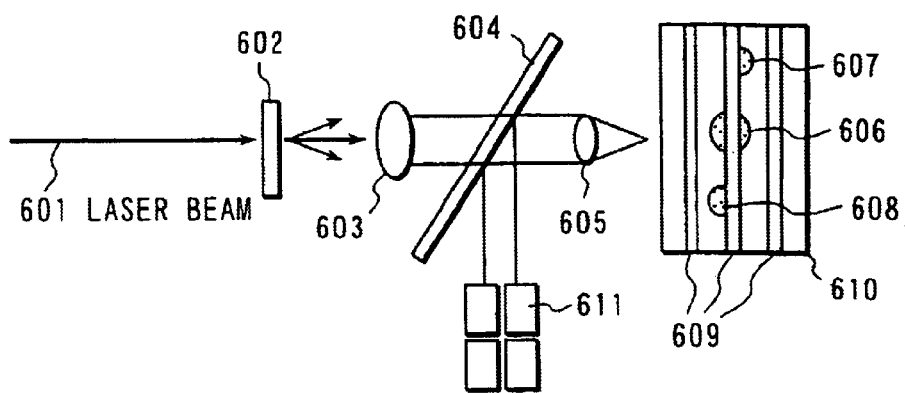
FIG. 9 is a schematic view of a semiconductor laser device for an optical pickup, using a 3-beam method according to the present invention and the prior art.

The sub-mount 102 is mounted on a heatsink 108. The sub-mount 102 has an upper surface and four side surfaces vertical to the upper surface. Of these side surfaces, the side surface in line with the laser beam emission facet of the LD chip 101, i.e., the side surface positioned just bellow the laser beam emission facet of the LD chip 101 is inclined. This inclined side surface (hereinafter called an inclined surface) 111 is oblique to the laser beam emission facet at an angle θ. The angle θ is set within a range of 3 to 30 degrees, for example, in correspondence with the NA of the collimator lens. 3-beam returning light 106 which is incident to the inclined surface 111 of the sub-mount 102 is reflected by the inclined surface 111 to become reflection light 107 of the 3-beam returning light. This reflection light 107 is inclined at angle 2θ to the 3-beam returning light 106 as incident light. In case of a collimator lens having NA=0.1 (see FIG. 9), the reflection light 107 of the 3-beam returning light 106 does not enter into the collimator lens if θ=3 is given. Therefore, this reflection light 107 is not a noise source which influences tracking errors.

In an actual optical system, the 3-beam returning light is not always vertical to the laser beam emission facet of the LD chip. In addition, the installation position of the collimator lens varies with respect to the heatsink, and the installation position of the collimator lens varies with respect to the diffraction grating. Therefore, the incident angle to the laser beam emission facet is a much larger value. However, if these components are positioned so that the coupling efficiency between the light output of the LD chip and the optical system reaches a practically useful level, the incident angle of the 3-beam returning light is about twice the estimated angle of the collimator lens at most. If this is taken into consideration, a sufficiently effective result can be obtained if the inclination angle θ of the inclined surface 111 of the sub-mount is set substantially to 30 degrees. If the reflection rate of the side surface of the sub-mount is as small as several %, the inclination angle can further be reduced. In this case, a sufficient effect can be obtained if the inclination angle of the inclined surface 111 of the sub-mount is within a range of 3–15 degrees, for example.

Figure 2:
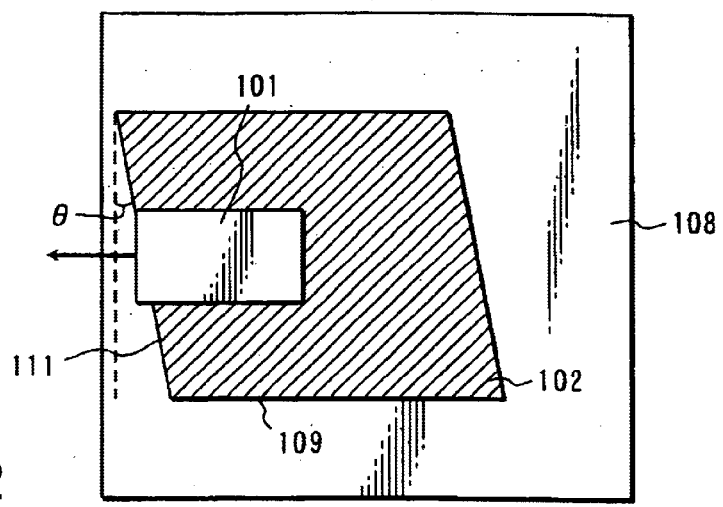
FIG. 2 is a plan view showing the semiconductor laser device, viewed from the upper side.

FIG. 2 is a plan view of the semiconductor laser device shown in FIG. 1, viewed from it upper side. In this embodiment, the heatsink 108 has a substantially square or rectangular shape, and the sub-mount 102 has a parallelogramatical shape. The LD chip 101 has a rectangular shape. Edges of the LD chip 101 and the heatsink 108 that are opposed to each other are substantially parallel to each other. Two edges of the LD chip 101 are parallel to two edges of the sub-mount 102, and the other two edges of the latter are oblique at an angle θ to the other two edges of the former. That is, the inclined surface 111 positioned just below the laser beam emission facet of the LD chip 101 is inclined at an angle θ to the laser beam emission facet.

In general, the LD chip mounted with junction-down is provided such that its laser beam emission facet slightly projects from the side surface of the sub-mount, to prevent interference with a laser beam. In this embodiment, a part of the laser beam emission facet contacts the side surface of the sub-mount. However, the other part of the laser beam emission facet is distant from the side surface of the sub mount. Thus, interference with the laser beam is prevented.

In the sub-mount 102, as shown in FIG. 1, an element electrode 110 is formed on its upper surface, and a lower electrode 104 is formed on its lower surface. The lower electrode 104 is joined to the heatsink 108 by solder 105. The inclined surface 111 of the sub-mount 102 has an angle (θ+90) degrees to the side surface 109 adjacent to the inclined surface 111.

Figure 3:
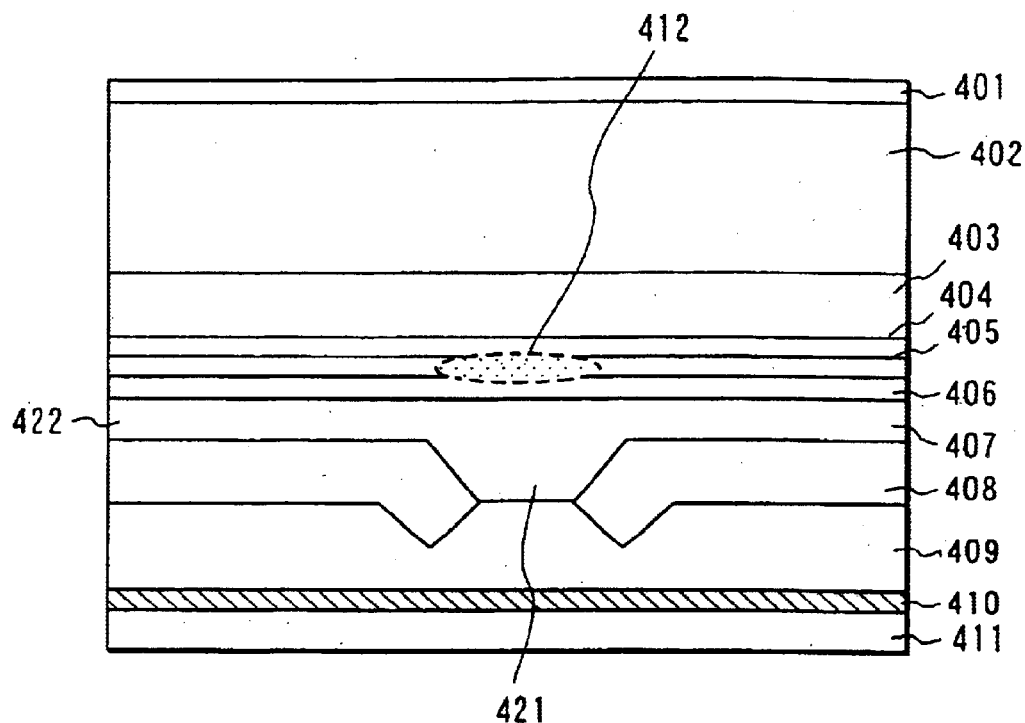
FIG. 3 is a cross-sectional view of a semiconductor laser element used in the semiconductor laser device according to the first embodiment of the present invention.

Desirably, the material of the sub-mount 102 has a coefficient of linear expansion which is approximate to that of the material of the LD chip 101, and an excellent thermal conductivity. Further, the material of the sub-mount 102 needs to be easily processable. An AlGaAs MQW (Multiple Quantum Well) laser for CDs as shown in FIG. 3 uses, for example, GaAs as its substrate material. The coefficient of linear expansion of GaAs is $6.4 \times 10^{-6}$ (1/K). The materials shown in Table 1 have a coefficient of linear expansion of $3.5 \times 10^6$ (1/K) to $8 \times 10^{-6}$ (1/K), which is approximate to the above-mentioned coefficient and have an excellent thermal conductivity of 140 W/m·k or more. That is, the materials are aluminum nitride (AlN), silicon carbide (SiC), silicon, or the like, shown in Table 1.

TABLE 1

| Material | Coefficient of linear expansion ($\times 10^{-6}$ K 1) | Thermal conductivity (W/m · k) |
| --- | --- | --- |
| AlN | 4.5 | 200 or more |
| SiC | 3.7 | 210 |
| Si | 4.2 | 151 |
| Cu | 16.5 | 395 |
| Fe | 11.8 | 72 |

The materials of the sub-mount each have a coefficient of linear expansion of an order substantially equal to that of GaAs. In contrast, copper (Cu), iron (Fe), or the like used as the material of the heatsink has a very large coefficient of linear expansion. Therefore, the materials of the sub-mount described above can much more relax the thermal stress acting on the LD chip, compared with the case of directly die-bonding the LD chip to the material of the heatsink.

A multi-layered film structure in which films of Titanium (Ti) and Gold (Au) are each formed to have thicknesses of 10 nm to several tens nm can be considered as the material for the lower electrode of the sub-mount and the element electrode. Further, a Ti/Pt/Au multi-layered structure including platinum (Pt) as a barrier metal between the Ti and Au forming the multi-layered film structure. By using these electrodes, the laser element can be easily soldered to the sub-mount with use of AuSn solder (solder 411 shown in FIG. 3). The multi-layered film structure described above can be formed by a manufacturing method suitable for mass-production such as magnetron sputtering. In the case of preparing the structure by vacuum evaporation or the like, it is desirable that Chrome (Cr) is added between the Ti of the multi-layered film structure and the heatsink, to form a structure of Chrome/Titanium/Gold (Cr/Ti/Au). By adopting this structure, sticking strength can be improved.

Figure 6:
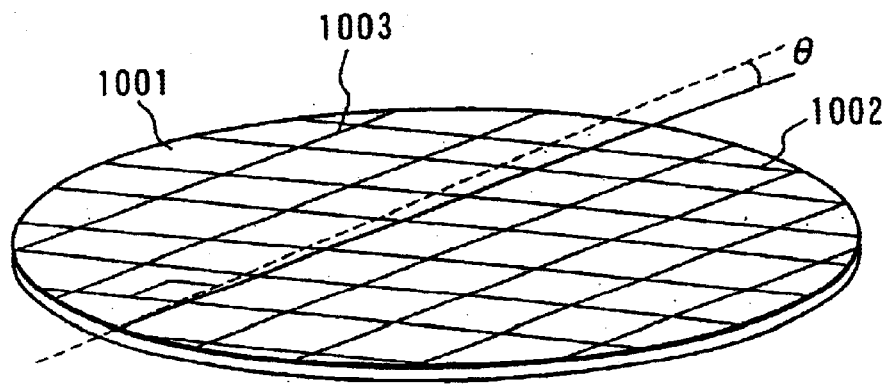
FIG. 6 is a perspective view of a sub-mount substrate and explains a method for manufacturing a sub-mount having a countermeasure against 3-beam returning light, according to the present invention.

FIG. 6 shows an example of a method of manufacturing the sub-mount 102 shown in the first embodiment. The sub mount 102 can be formed by dicing a substrate as a wafer, for example. If the angle of the inclined surface 111 of the sub-mount 102 is set to 10 degrees, a normally used blade is used to cut a predetermined width of the substrate 1001 along a first dicing line 1002. Thereafter, the substrate 1001 is cut in parallel with a second dicing line 1003. The second dicing line 1003 is further inclined by 10 degrees from the direction perpendicular to the first dicing line 1002. That is, the second dicing line 1003 is inclined at 90°+10°=100° to the first dicing line 1002. By the dicing in this manner, the sub-mount 102 shown in FIGS. 1 and 2 can be manufactured. The dicing is not limited to the order described above. However, cutting may be carried out firstly along the second dicing line and next along the first dicing line.

Figure 12A:
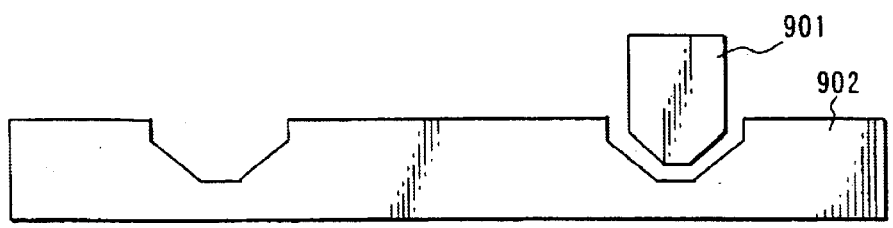
FIGS. 12A and 12B are cross-sectional views explaining a method of manufacturing a sub-mount having a conventional countermeasure against 3-beam returning light.
Figure 12B:

The sub-mount 102 shown in the first embodiment does not require the depth of the blade or the adjustment of the position as shown in FIGS. 12A and 12B. Therefore, the sub-mount 102 shown in the first embodiment required less complicated operations than a conventional sub-mount as a countermeasure against three beams, so that its mass-productivity is much increased.

When the sub-mount 102 is die-bonded to the metal-made heatsink, positioning is carried out by letting the side surface of the sub-mount just below the laser beam emission facet contact a positioning pin. In this case, the pin is previously inclined by the inclination angle of the sub-mount 102 to the laser beam direction. Then, a die-bonding apparatus used for a conventional sub-mount can be used. Accordingly, an advantage can be attained in that the productivity can be improved without requiring any new equipment.

In many cases, the sub-mount for a semiconductor laser is soldered to a heatsink made of Cu or Fe plated with Au/Ne or the like, with use of AuSn solder having an atomic % ratio of 80:20. In this name, the LD chip is firstly die-bonded to the sub-mount, and next, the sub-mount is die-bonded to the heatsink. Thereafter, a pallet of AuSn solder is supplied between the heatsink and the sub-mount on which only a lower electrode is formed, and the sub-mount equipped with the LD chip is die-bonded to the heatsink.

Meanwhile, in case where the sub mount is firstly soldered to the heatsink and the LD chip is next die-bonded to the sub mount, the pellet of AuSn solder is not supplied at this time but AuSn solder having a constant film thickness and the atomic % ratio of 80:20 is previously deposited by evaporation on the lower electrode 104, as shown in FIG. 1. In this structure, the amount of solder used for soldering can be constant so that the productivity in die-bonding can be improved greatly. If the solder thickness is too small, die-bonding is difficult. Otherwise, if it is too large, solder oozes out around and causes short-circuiting on the LD chip joint surface. Therefore, soldering is arranged such that the film thickness is within a range of 80 nm to 5 μm, consistent with the die-bonding conditions.

FIG. 3 shows an example of the LD chip which is die-bonded to the sub-mount. FIG. 3 is a cross-sectional view showing the structure of the laser beam emission facet of the LD chip. In the LD chip, an n-electrode 401 is formed on one surface of an n-GaAs substrate 402, and a plurality of semiconductor layers are stacked on the surface opposite to the n-electrode 401. That is, an n-cladding layer 407, a guide layer 406, an MQW active layer 405, a guide layer 404, and a p-cladding layer 403 are sequentially formed by epitaxial growth using MO-CVD (Metal Organic Chemical Vapor Deposion) or MBE (Molecular Beam Epitaxy) technique. The MQW active layer 405 is one for laser emission and consists of AlxGa(1−x)Ac layers as well ones and AlzGa(1−z)As layers as barrier ones (0≦x<z<1). n-cladding and p-cladding layer compositions are AlyGa(1 y)As (z<y<1). Guide layers 404 and 406 made of Alz Ga(1−Z)As are formed on both sides of the MQW active layer 405. The MQW active layer 405 and the guide layers 404 and 406 are sandwiched between cladding layers 403 and 407 made of n-Aly Ga(1−y)As. An n-GaAs current blocking layer 408 and a p-GaAs contacting 409 are sequentially layered on the cladding layer 407. The current blocking layer 408 is not formed near an area just below the light emission part 412, but the p-cladding layer 407 and the p-contacting layer 400 directly contact each other. A portion of the cladding layer 407 located under the light emission part 412 forms a ridge part 421. The part of the cladding layer 407 other than the area corresponding to the light emission part 412 is a flat part 422. A p-electrode 410 is formed on the contacting layer 409, and AuSn solder 411 is provided thereon.

The LD chip has an AlGaAs MQW active layer and a cladding layer, and the cladding layer 407 has a ridge part 421 and a thin flat part 422. An n-GaAs current stop layer 408 covers both side surfaces of the ridge part 421 and the upper side of the thin cladding layer 407. This is called an SBR (Selectively Buried Ridge) structure. Controllability in the lateral mode is so excellent that the astigmatism is small, and the structure can be driven at a low current so that operation at a high temperature can be achieved. By combining the sub-mount having a structure shown in FIG. 1 with the LD chip shown in FIG. 3, it is possible to provide a semiconductor laser device for an optical pickup, which can operate at a high temperature with low noise.

For example, a Gold Zinc (AuZn) layer which has an excellent characteristic as ohmic contact material is used for the p-electrode 410 of the LD chip. This Gold Zinc (AuZn) layer is formed on the p-GaAs contacting layer 409. A Molybdenum (Mo) layer or Pt layer as a barrier metal is provided on the Gold Zinc (AuZn) layer, and an Au layer is formed as the uppermost layer. To form layers, an electron beam evaporation apparatus which has excellent film thickness controllability is used. If an acceptor having a sufficient concentration is formed in the p GaAs contacting layer 409, Ti is formed on the p-GaAs contacting layer 409, and a barrier metal layer such as Mo or Pt is provided on the Ti, and an Au layer is formed as the uppermost layer. In the case of using the p-electrode 410 having this structure, annealing process indispensable to the case of an electrode using AuZn is unnecessitated. Therefore, an electrode manufacturing step can be omitted.

An AuSn solder film having an atomic % ratio 80:20 and a thickness of 80 nm to 5 μm is deposited by evaporation on the p-electrode 410. The LD chip shown in FIG. 3 has a structure which is excellent in productivity, as an LD chip to be die-bonded to a sub-mount by junction-down.

Figure 10:
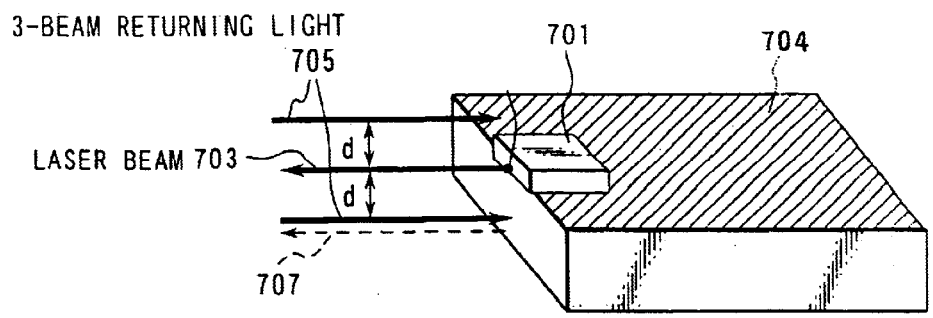
FIG. 10 is a schematic view which explains returning light of a 3-beam optical system.
Figure 11:
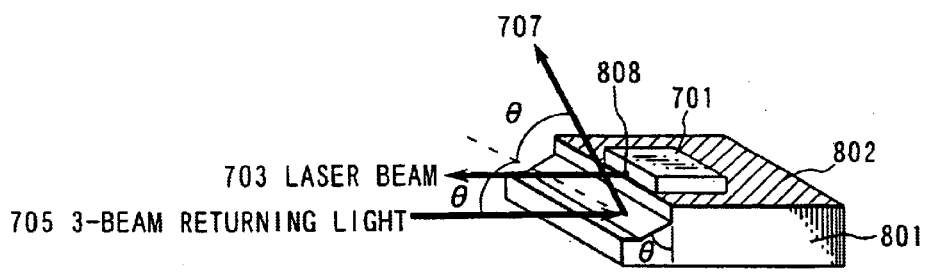
FIG. 11 is a perspective view of a semiconductor laser device and explains a conventional countermeasure against 3 beam returning light.

As shown in FIG. 10, the 3-beam returning light also returns to the upper side of the laser beam emission facet of the LD chip. In the case where the LD chip is mounted by junction-down, the thickness T of the LD chip in FIG. 1 may be reduced to be less than the distance between the laser beam and the 3-beam returning light, in order to avoid influences from the 3-beam returning light. The distance d changes depending on the design of the optical system. The thickness T of the LD chip is set from 60 to 150 μm. That is, after the p-electrode 410 shown in FIG. 3 is formed, the back surface of the n-GaAs substrate 402 is generally polished to reduce the thickness of the wafer, in order to facilitate bar-cleavage and chip-cleavage for cleaving a wafer into a plurality of chips like bars. In this polishing step, the thickness of the LD chip is set to T.

The first embodiment uses an LD chip having the SBR structure. However, the first embodiment is not limited to this structure but is applicable to any kind of structure used for an optical pickup for CDs, which is die-bonded to a sub-mount by junction-down.

Next, the second embodiment will be explained with reference to FIGS. 4, 5, and 7.

Figure 4:
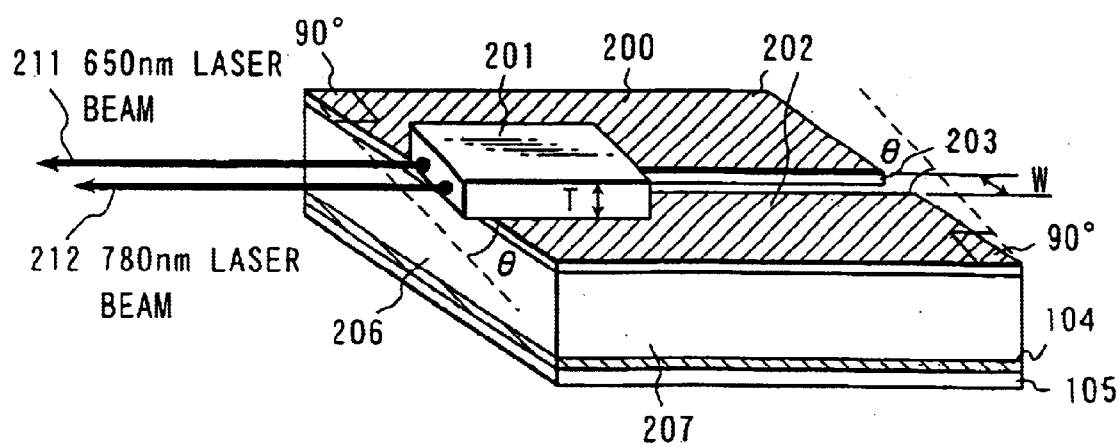
FIG. 4 is a schematic perspective view showing a semiconductor laser device according to the second embodiment of the present invention.

FIG. 4 shows a two-wavelength laser device according to the second embodiment of the present invention. An LD chip 201 includes a laser element which omits a laser beam 212 with a 780-nm-band wavelength for a CD and a laser element which oscillates a laser beam 211 with a 650-nm-band wavelength for a DVD (Digital Versatile Disk). That is, both of the laser elements are formed monolithically on a substrate forming the LD chip 201, such that the stripe structures of the active layers of both laser elements are parallel. This laser device is suitable for an optical pickup which reads optical disks of both of CD and DVD.

In the case of a conventional pickup used in common for both CD and DVD, a laser device which lases in a 780-nm-band for an optical pickup for CD and a laser device which lases in a 650-nm-band for an optical pickup for DVD are installed by making optical position adjustment. In contrast, two laser elements can be incorporated in one package if a two-wavelength laser element shown in FIG. 5 is used. In addition, two striped active layers are formed monolithically, so that the distance between beams can be maintained with high precision. Therefore, the number of optical elements in an optical pickup can be reduced, and services for position adjustment of respective components can be greatly reduced. In this manner, costs for productivity of the optical pickup can be greatly reduced.

Figure 5:
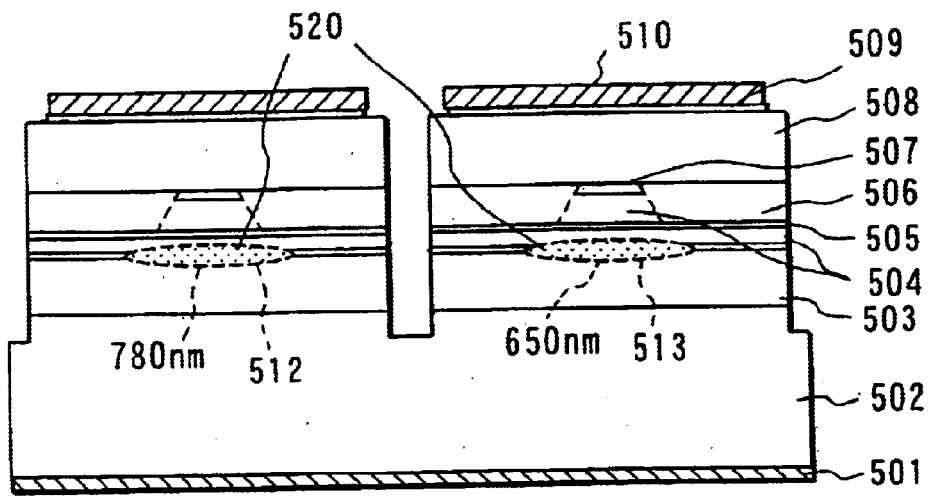
FIG. 5 is a cross-sectional view of a semiconductor laser element used in the semiconductor laser device according to the second embodiment of the present invention.

An active layer 512 shown in FIG. 5 corresponds to the laser beam having a wavelength of 780 nm shown in FIG. 4, and another active layer 513 also shown in FIG. 5 corresponds to the laser beam with a 650-nm-wavelength also shown in FIG. 4. It is necessary to drive currents independently in active layers 512 and 513 to enable independent lasing from the active ones. Therefore, the active layers 512 and 513 are electrically isolated from each other, and p-cladding layers 504, p-electrodes 509, and portions of solder 510 formed for the active layers 512 and 513 are electrically isolated from each other.

The LD chip 201 is provided on a sub-mount 200. The plane shape of the sub-mount is arranged to be, for example, a parallelogram like the first embodiment. Therefore, the sub-mount 200 has an inclined surface 206 just below the laser beam emission facet of the LD chip 201.

The LD chip 201 is die-bonded to the sub-mount 200 by junction-down. Therefore, the sub-mount 200 shown in FIG. 4 has, for example, two element electrodes 202 which are electrically isolated from each other. These element electrodes 202 respectively correspond to p-electrodes 509 of the laser elements shown in FIG. 5.

Figure 7:
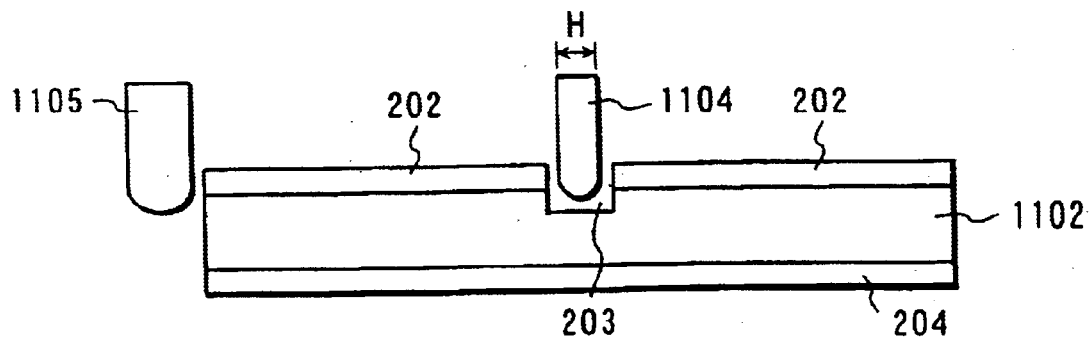
FIG. 7 is a cross-sectional view of a sub-mount substrate and explains a method for manufacturing a sub-mount having a countermeasure against 3-beam returning light, according to the present invention.

FIG. 7 shows an example of a cutting method for forming the sub-mount 200 having a structure shown in FIG. 4. At first, a sub-mount substrate 1102 is cut shallowly by an electrode separation blade 1104 having a small width, to remove a part of an element electrode thereby to form an electrode isolation part 203. Two electrodes 202 are thus formed by the electrode isolation part 203. Next, the sub-mount is cut by a sub-mount separation blade 1105 having a large width. This cutting is the same as the method shown in FIG. 6. In a two-wavelength laser, it is demanded that the distance between the laser beams of 780 nm and 650 nm should be 100 μm to 200 μm. In consideration of variants of the die-bonding position of the LD chip, the width W of the electrode isolation part 203 (see FIG. 4) should desirably be 70 µm or less. Therefore, the width H of the electrode separation blade 1104 should desirable be 50 µm or less.

According to the second embodiment of the present invention, the electrode isolation part 203 of the LD chip, an inclined surface 206 thereof having an angle θ, and a side surface 207 thereof which is adjacent to the inclined surface 206 and substantially parallel to the laser beams are all formed by dicing. In addition, adjustment on the positions and depths of the blades are relatively easy with respect to formation of the electrode isolation part 203, inclined surface 206, and side surface 207. Therefore, this sub-mount 200 is excellent in mass-productivity.

Other methods than cutting can be considered with respect to formation of the electrode isolation part 203 of the sub-mount 200. For example, there are a method of etching a substrate in a state where the other part than the electrode isolation part 203 is masked with use of photolithography, a method of removing electrode parts by lift-off also with use of the photolithography, a method of selectively forming electrodes for a two-wavelength element with use of laser cutting using a YAG laser or the like and a metal mask, and the like. A selection is made from these methods in accordance with the width W of the electrode isolation part and the size of burrs formed at edges of the electrodes.

In the LD chip shown in FIG. 5, the active layer 512 for the wavelength band of 780 nm is an AlGaAs bulk active layer, and the active layer 513 for the wavelength band of 650 nm is an InGaAlP MQW active layer. The active layers 512 and 513 respectively have InGaAlP cladding layers 503 and 504 having a common composition. The cladding layer 503 is formed on the n-GaAs substrate 502. The n-electrode 501 is formed on the back surface of the n-GaAs substrate 502. Further, the p-cladding layer 504 has a ridge, and both side surfaces of the ridge and the p-cladding layer 504 are covered in common with a current blocking layer 506 made of n-GaAs.

The SBR structure is thus formed. This SBR structure has small astigmatism since the controllability in the lateral mode is excellent as previously described. In addition, the structure can operate at a high temperature since it can be driven at a low current. An etching stop layer 505 made of InGaP is formed on the p cladding layer 504. A conductive layer 507 made of p-InGaP formed on the narrow p-cladding layer 504 sandwiched between current blocking layers 506. A contacting layer 508 is formed on the current blocking layers 506 and the conductive layer 507. A p-type electrodes 509 isolated for every element is formed on the contacting layer 508. AuSn solder 510 is formed on the p-electrode 509.

Thus, a semiconductor layer apparatus for an optical pickup, which is capable of operating at a high temperature with low noise, can be obtained by combining the semiconductor laser element shown in FIG. 5 with the sub-mount having the structure shown in FIG. 4. Also, according to the semiconductor laser element shown in FIG. 5, two elements of different wavelengths can be formed in one chip. And, the distance between two beams can be controlled precisely using photolithographic technique. Accordingly, margins can be obtained with respect to the positional precision concerning the width W of the electrode separation part of the sub-mount or the die-bonding. It is therefore possible to provide a two-wavelength semiconductor laser device which has excellent mass-productivity.

A Gold zinc (AuZn) layer having an excellent characteristic as ohmic contact material is used as the p-electrode 509 of the LD chip shown in FIG. 5. This Gold Zinc (AuZn) layer is formed on the p-GaAs contacting layer 508. A Molybdenum (Mo) layer or Pt layer as a barrier metal is provided on the Gold Zinc (AuZn) layer, and an Au layer is formed as the uppermost layer. To form layers, an electron beam evaporation apparatus which has excellent film thickness controllability is used. If an acceptor having a sufficient concentration is formed in the p-GaAs contacting layer 508, Ti is formed on the p-GaAs contacting layer 508, and a barrier metal layer such as Mo or Pt is provided on the Ti, and an Au layer is formed as the uppermost layer. In the case of using the p-electrode 509 having this structure, annealing process indispensable to the case of an electrode using AuZn is obviated. Therefore, an electrode manufacturing step can be omitted.

An AuSn solder film 510 having an atomic % ratio of 80:20 and a thickness of 80 nm to 5 µm is deposited by evaporation on the p-electrode 509. The LD chip shown in FIG. 5 has a structure which is excellent in productivity, as an LD chip to be die-bonded to a sub-mount by junction-down.

The solder 510 formed on the p-electrode 509 of each element is separated, for example, by etching with use of photolithography. This etching process requires only one photolithography step. Therefore, margins can be obtained with respect to positional precision of die-bonding to the sub-mount in the second embodiment. This manufacturing method includes simple steps and is therefore excellent in productivity.

As shown in FIG. 10, 3-beam returning light also returns to the upper side of the laser beam emission facet of LD chip. In case where the LD chip is mounted by junction-down, the thickness T of the LD chip may be set to be smaller than the distance d between each laser beam and the 3-beam returning light, in order to avoid influences of the 3-beam returning light. The distance d changes depending on the design of the optical system. Thickness of the LD chip, however, is set within a range of 60 to 150 µm. That is, after forming the p-electrode 509 shown in FIG. 5, the back surface of the n-GaAs substrate 502 is polished to reduce the thickness of the wafer, in order to facilitate bar cleavage and chip-cleavage. In this polishing step, the thickness of the LD chip is set to T.

The second embodiment uses a two-wavelength LD chip having an SBR structure. However, the second embodiment is not limited to this LD chip but is applicable to any monolithic two-wavelength laser that is die-bonded to a sub-mount by junction-down.

Next, the shape and layout of the sub-mount used in the present invention will be explained with reference to FIGS. 8A and 8B.

In the first and second embodiments, the plane shape of the sub-mount is a parallelogram. However, the shape of the sub-mount is not limited thereto. The sub-mount needs only to have an inclined surface inclined to the laser beam emission facet of the semiconductor laser chip, just below the emission facet.

Figure 8A:
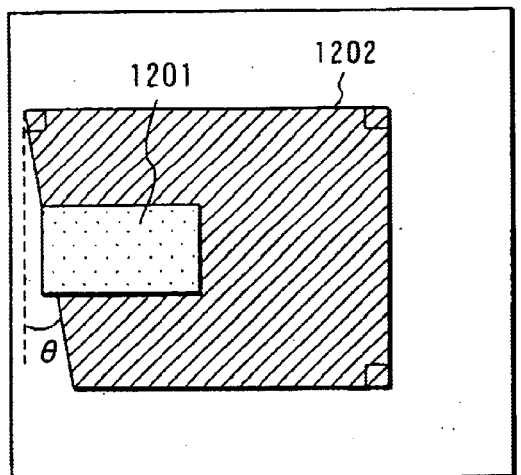
FIGS. 8A and 8B are plan views showing modifications of the semiconductor laser device according to the present invention.

In a sub-mount 1202 shown in FIG. 8A, the only one edge that corresponds to the laser beam emission facet of the LD chip 1201 is inclined at an angle θ to the vertical direction. This sub-mount 1202 is mounted on a heatsink 1208. The other edges of the sub-mount 1202 than the inclined edge are parallel to the corresponding edges of the heatsink 1208.

Figure 8B:
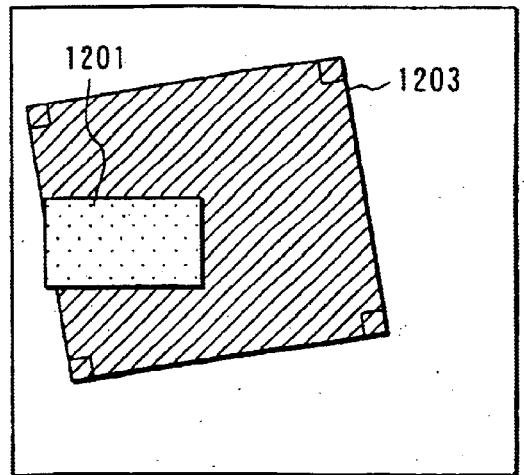

The shape of a sub-mount 1203 shown in FIG. 8B is, for example, a square or rectangle. The LD chip 1201 is mounted on the sub-mount 1203. The laser beam emission facet of this LD chip 1201 is inclined at a predetermined angle θ to one edge of the sub-mount 1203. The sub-mount 1203 on which the LD chip 1201 is mounted in further mounted on a heatsink 1208. The edges of the sub-mount 1203 are arranged at an angle θ to the edges of the heatsink 1208, respectively. Therefore, the edges of the LD chip 1201 are respectively parallel to the edges of the heatsink 1208. The same advantages as those of the first and second embodiments can be attained by the structures shown in FIGS. 8A and 8B.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor laser device, comprising:
a semiconductor laser chip having a first surface of which shape is approximately rectangular or square, and having an emission facet for emitting a laser beam; and
a sub-mount having a first surface on which the semiconductor laser chip is provided, and at least one second surface vertical to the first surface, the first surface of the sub-mount having parallel first edges and parallel second edges between the first edges, the second edge being inclined at an angle of 3 to 30 degrees to the first edges, the first edges being parallel to the edges of the first surface of the semiconductor laser chip, one of the second edges being corresponding to the emission facet,
wherein the one second surface including one of the second edges corresponding to the emission facet inclines along with the at least one of the second edges and reflects an incident light orthogonal to the emission facet of the semiconductor laser chip to a different direction in accordance with the angle of the second surface.

2. The device according to claim 1, wherein the angle of the second surface which is inclined is set to 3 to 15 degrees to the emission facet.

3. The device according to claim 1, wherein a shape of the first surface of the sub mount is a parallelogram.

4. The device according to claim 1, wherein the semiconductor chip has a thickness of 60 to 150 μm.

5. The device according to claim 1, wherein material of the sub-mount is one of AlN, SiC, and Si.

6. A semiconductor laser device comprising:
a semiconductor laser chip having a first surface of which shape is approximately rectangular or square, and having an emission facet for emitting two laser beams; and
a sub-mount having a first surface on which the semiconductor laser chip is provided, and at least one second surface vertical to the first surface, the fist surface of the sub-mount having parallel first edges and parallel second edges between the first edges, the second edges being inclined at an angle of 3 to 30 degrees to the first edges, the first edges being parallel to the edges of the fist surface of the semiconductor laser chip, one of the second edged being corresponding to the emission facet,
wherein the one second surface including one of the second edges corresponding to the emission facet inclines along with the one of the second edges and reflects an incident light orthogonal to the emission facet of the semiconductor laser chip to a different direction in accordance with the angle of the second surface.

7. The device according to claim 6, wherein the semiconductor laser chip emits a first laser beam having a first wavelength and a second laser beam having a second wavelength.

8. The device according to claim 7, wherein the first wavelength band is 780 nm, and the second wavelength baud is 650 nm.

9. The device according to claim 6, wherein the semiconductor laser chip has first and second electrodes, end the sub-mount has third and forth electrodes connected with the first and second electrodes.

10. The device according to claim 9, the sub-mount has a slit between the third and fourth electrodes.

11. The device according to claim 6, wherein the angle of the second surface which is inclined is set to 3 to 15 degrees to the emission facet.

12. The device according to claim 6, wherein a plane shape of the semiconductor laser chip is a rectangle or square.

13. The device according to claim 12, wherein the semiconductor chip has a thickness of 60 to 150 μm.

14. The device according to claim 6, wherein material of the sub-mount is one of AlN, SiC, and Si.

15. An optical pickup apparatus comprising:
a semiconductor laser device which emits a laser beam;
a diffraction grating which diffracts the laser beam from the semiconductor laser device and which outputs the laser beam and a sub-beam;
a collimator lens which makes the laser beam and the sub-beam from the diffraction grating be parallel to each other;
a half-mirror which allows the laser beam and the sub-beam from the collimator lens to pass;
an objective lens which guides the laser beam and the sub-beam from the half-mirror to all optical disk; and
a light receive element which receives reflection light from the optical disk through the objective lens and the half-mirror and, which converts the reflection light received into an electrical signal, wherein
the semiconductor laser device comprises a semiconductor laser chip having an emission facet for emitting a laser beam, and a sub-mount having a first surface on which the semiconductor laser chip is provided, and at least one second surface vertical to the first surface, the first surface of the sub-mount having parallel first edges and parallel second edges between the first edges, the second edges being inclined at an angle of 3 to 30 degrees to the first edges, the first edges being parallel to the edges of the first surface of the semiconductor laser chip, one of the second edges being corresponding to the emission facet,
wherein the one second surface including one of the second edges corresponding to the emission facet reflects an incident light orthogonal to the emission facet of the semiconductor laser to a different direction in accordance with the angle of the second surface.

16. The apparatus according to claim 15, wherein the semiconductor laser chip emits a first laser beam having a first wavelength and a second laser beam having a second wavelength.

17. The apparatus according to claim 16, wherein the first wavelength band is 180 nm, and the second wavelength band is 650 nm.

18. The apparatus according to claim 15, wherein the semiconductor laser chip has first and second electrodes, and the sub-mount has third and fourth electrodes connected with the first and second electrodes.

19. The apparatus according to claim 18, the sub-mount has a slit between the third and fourth electrode.

20. The apparatus according to claim 15, wherein the angle of the second surface which is inclined is set to 3 to 15 degrees to the emission facet.

21. The apparatus according to claim 15, wherein a plane shape of the sub-mount is a rectangle or square.

22. The apparatus according to claim 21, wherein a plane shape of the sub-mount is a parallelogram.

23. The device according to claim 1, further comprising a mount having a first surface on which the sub-mount is mounted, the first surface of the mount being a rectangle or square.

24. The device according to claim 23, wherein edges of the first surface of the mount which are parallel to each other are parallel to edges of the first surface of the sub-mount which are parallel to an optical axis of the laser beam.

25. The device according to claim 24, wherein the mount is a heatsink, and edges of the semiconductor laser chip which are parallel to each other are respectively parallel to edges of the heatsink.

* * * * *